(12) United States Patent
Wang et al.

(10) Patent No.: US 6,911,697 B1
(45) Date of Patent: Jun. 28, 2005

(54) SEMICONDUCTOR DEVICE HAVING A THIN FIN AND RAISED SOURCE/DRAIN AREAS

(75) Inventors: Haihong Wang, Fremont, CA (US); Judy Xilin An, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/632,965

(22) Filed: Aug. 4, 2003

(51) Int. Cl.⁷ .......................... H01L 27/01; H01L 29/76
(52) U.S. Cl. ........................ 257/347; 257/365
(58) Field of Search .................. 257/67, 328, 329, 257/347, 353, 365, 366; 438/149, 152, 164, 212, 268, 277, 479, 517

(56) References Cited

PUBLICATIONS

Copy of co–pending U.S. Appl. No. 10/653,234, filed Sep. 3, 2003, entitled: "Narrow Body Raised Source/Drain Metal Gate MOSFET," Bin Yu et al.; 27 pages.

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

*Primary Examiner*—Hung Vu
(74) *Attorney, Agent, or Firm*—Harrity & Snyder LLP

(57) ABSTRACT

A double-gate semiconductor device includes a substrate, an insulating layer, a fin, source and drain regions and a gate. The insulating layer is formed on the substrate and the fin is formed on the insulating layer. The source region is formed on the insulating layer adjacent a first side of the fin and the drain region is formed on the second side of the fin opposite the first side. The source and drain regions have a greater thickness than the fin in the channel region of the semiconductor device.

16 Claims, 19 Drawing Sheets

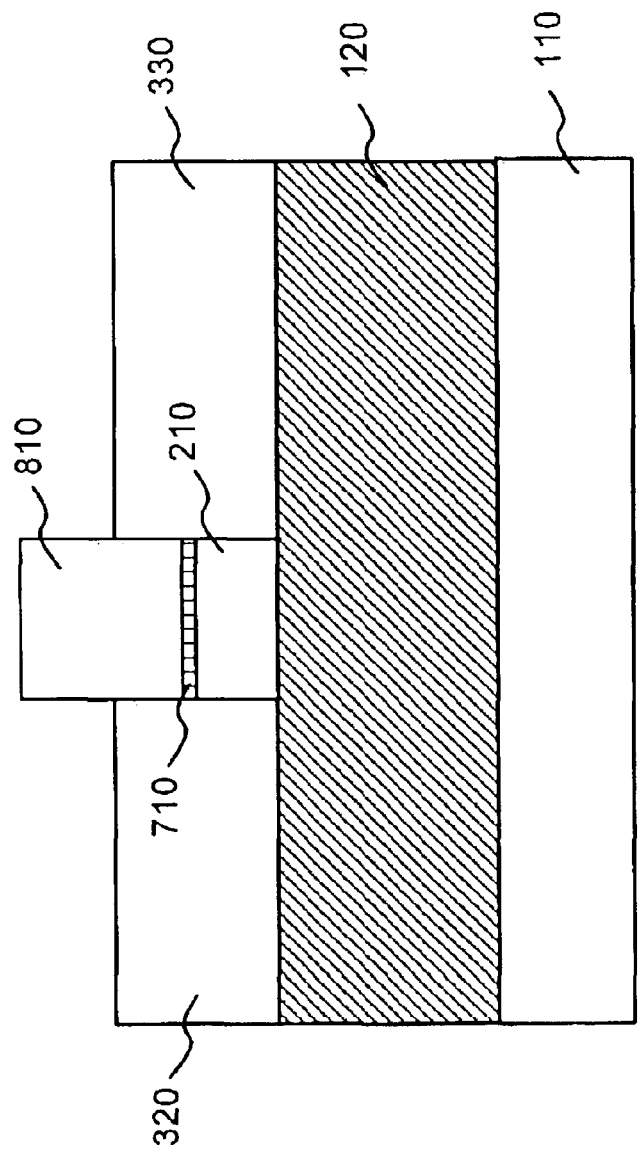

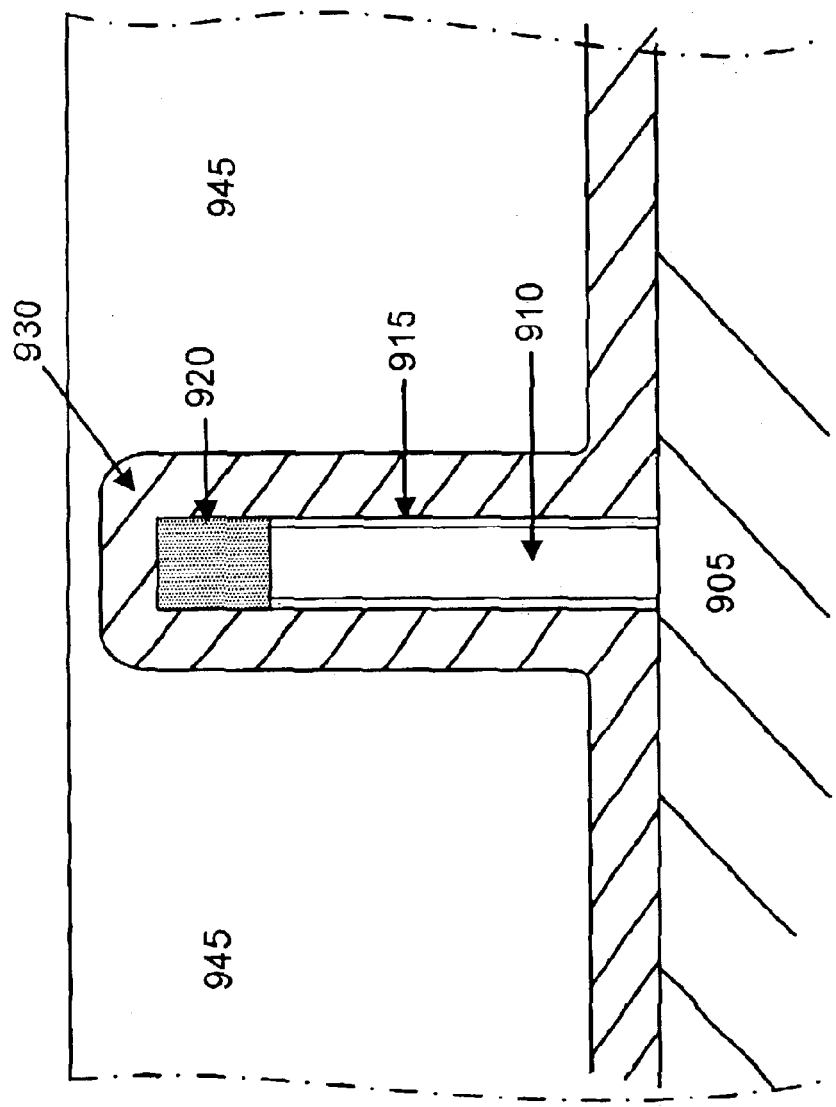

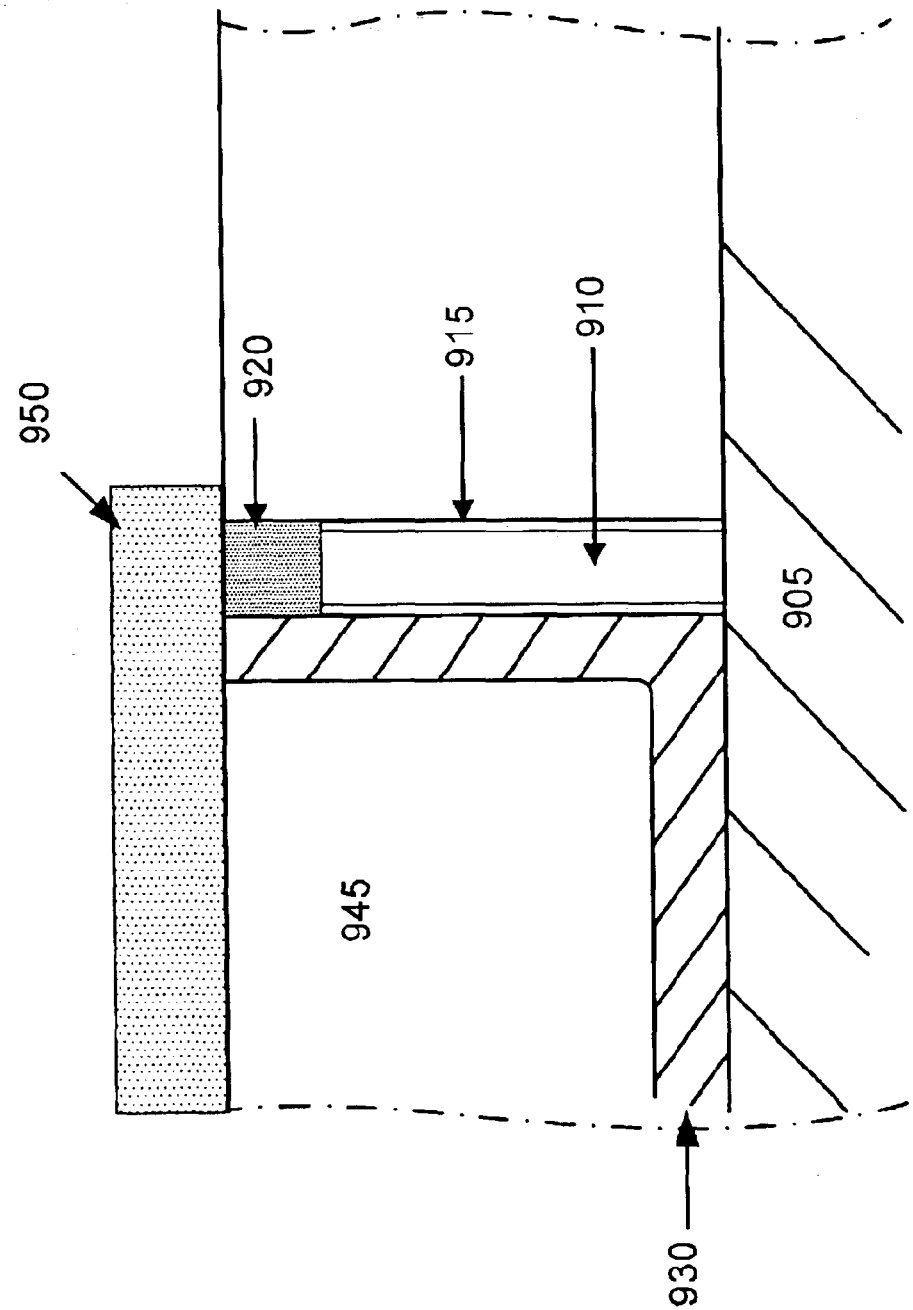

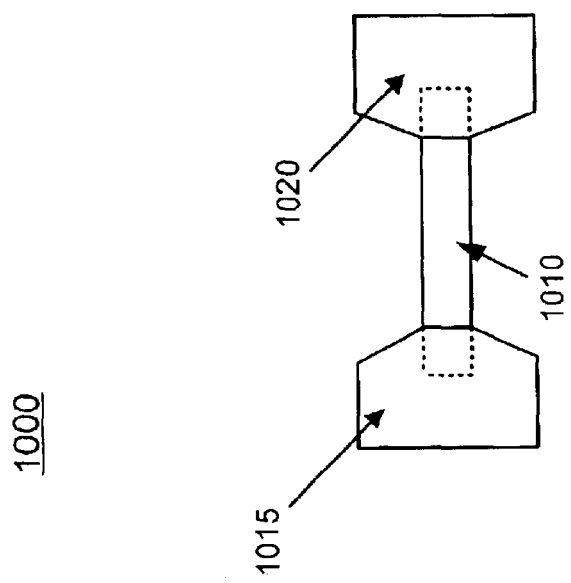
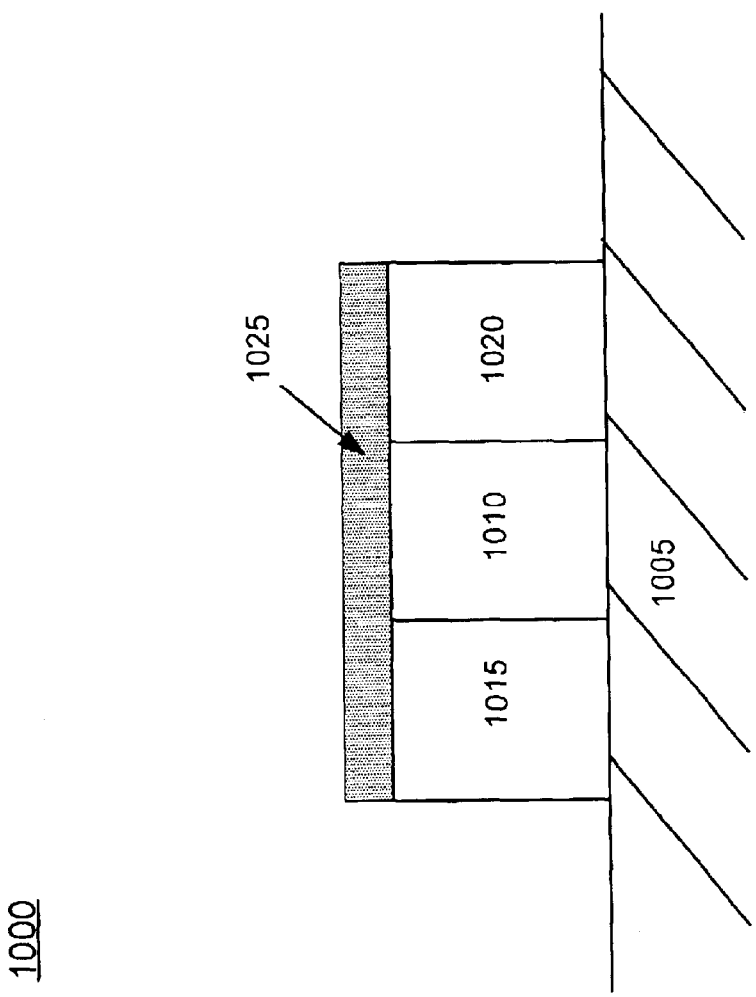
FIG. 10B
FIG. 10A

US 6,911,697 B1

SEMICONDUCTOR DEVICE HAVING A THIN FIN AND RAISED SOURCE/DRAIN AREAS

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may also be fabricated using layout and process techniques similar to those used for conventional planar MOSFETs.

DISCLOSURE OF THE INVENTION

Implementations consistent with the present invention provide a FinFET device with a thin fin and raised source/drain areas. By having raised source/drain areas, the source/drain resistance of the FinFET device may be reduced.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device that includes a substrate, an insulating layer, a fin, a source region and a drain region. The insulating layer is formed on the substrate and the fin is formed on the insulating layer. The source region is formed on the insulating layer adjacent a first side of the fin and the drain region is formed on the insulating layer adjacent a second side of the tin opposite the first side. The source and drain regions have a greater thickness than the fin.

According to another aspect of the invention, a method of manufacturing a semiconductor device is provided. The method includes forming a first mask over a silicon on insulator (SOI) wafer, where the SOI wafer includes a conductive layer on an insulating layer that is formed on a substrate. The method also includes etching a portion of the conductive layer to form a fin structure. The method further includes forming a source region and drain region adjacent respective ends-of the fin structure, forming a second mask over the source region and drain region and etching the fin structure to reduce the width and thickness of the fin structure. The method also includes depositing a gate material over the fin structure and patterning and etching the gate material to form a gate electrode.

According to a further aspect of the invention, a semiconductor device that includes a substrate, an insulating layer, a conductive fin, a source region and a drain region is provided. The insulating layer is disposed on the substrate and the conductive fin is formed on the insulating layer, where the conductive fin has a first end and a second end. The source region is formed adjacent the first end of the conductive fin and the drain region is formed adjacent the second end of the conductive fin. The source and drain regions each have a greater thickness than the conductive fin in the channel region of the semiconductor device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 8A is a cross-section illustrating the formation of a gate on the device of FIG. 7 in accordance with an exemplary embodiment of the present invention.

FIGS. 9A–9H are exemplary cross-sections and top views illustrating the formation of asymmetric gates in accordance with another embodiment of the present invention.

FIGS. 10A–10F are cross-sections and top views illustrating the formation of a asymmetric gates in accordance with a further embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide FinFET devices and methods of manufacturing such devices. The FinFET devices formed in accordance with the present invention include a thin fin with raised source/drain areas formed adjacent the fin. The resulting FinFET devices have reduced source/drain resistance as compared to conventional FinFET devices.

Figure 1:
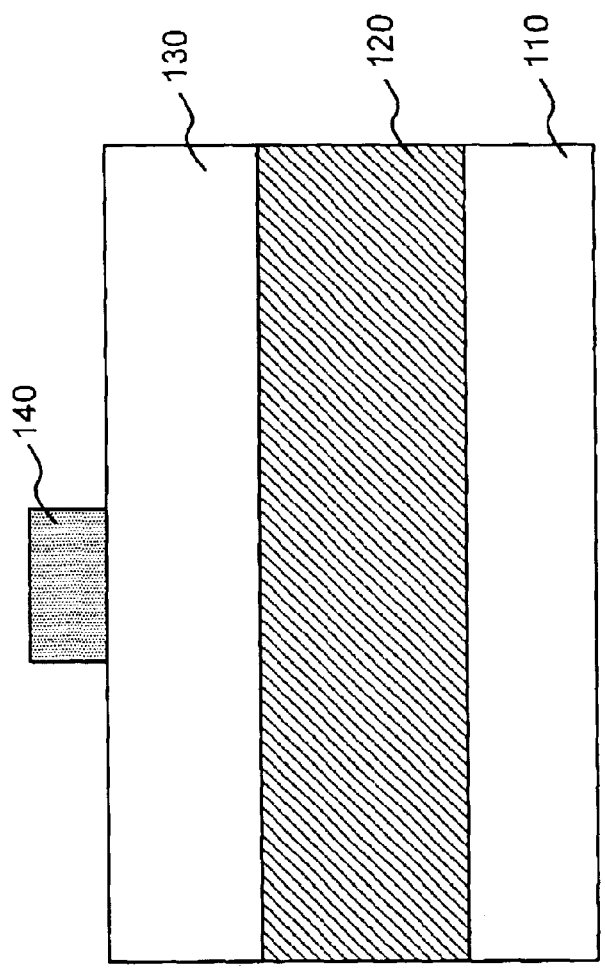
FIG. 1 is a cross-section illustrating exemplary layers that may be used for forming a fin in accordance with an embodiment of the present invention.

FIG. 1 illustrates the cross-section of a semiconductor device 100 formed in accordance with an exemplary embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form a fin for a FinFET device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

Next, a photoresist material may be deposited and patterned to form a photoresist mask 140 for subsequent processing, as illustrated in FIG. 1. The photoresist may be deposited and patterned in any conventional manner. In an exemplary implementation, the photoresist mask 140 may be trimmed to a width ranging from about 200 Å to about 500 Å.

Figure 2:
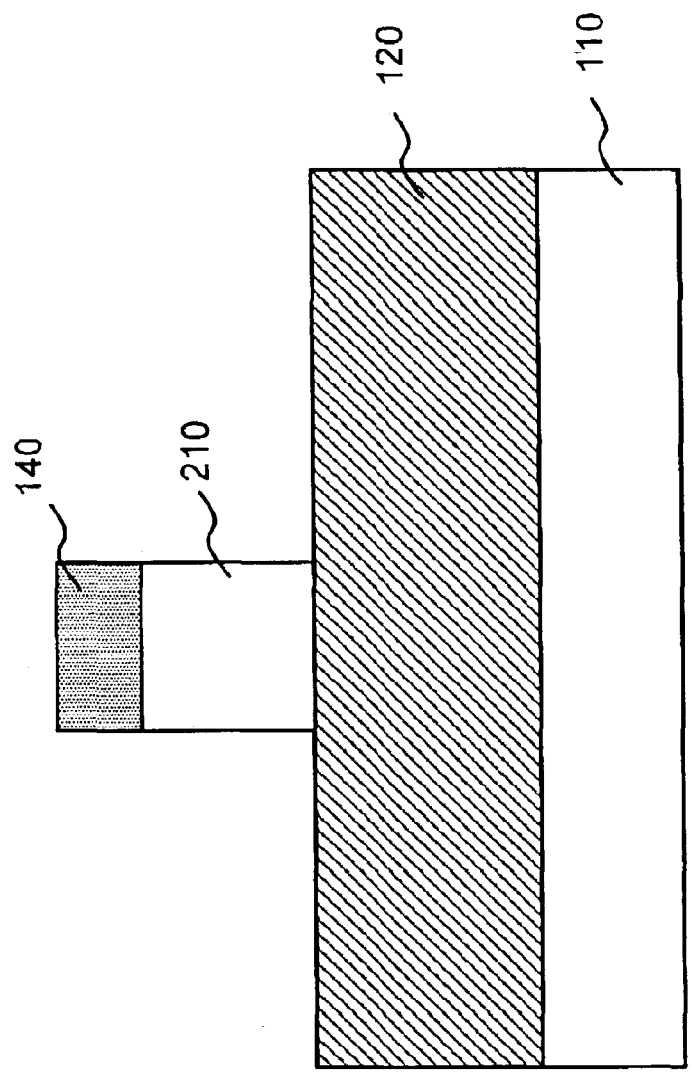
FIG. 2 is a cross-section illustrating the etching of the semiconductor device of FIG. 1 to form a fin in accordance with an exemplary embodiment of the present invention.

Semiconductor device 100 may then be etched to form the fin structure. In an exemplary implementation, the portion of silicon layer 130 not located below photoresist mask 140 may be etched in a conventional manner with the etching terminating on buried oxide layer 120, thereby forming fin 210, as illustrated in FIG. 2. Referring to FIG. 2, the fin 210 comprises silicon and may be formed to approximately the same width as photoresist mask 140 (e.g., a width of about 200 Å to about 500 Å).

After the formation of fin 210, source and drain regions may be formed adjacent respective ends of fin 210. For example, in an exemplary embodiment, a layer of silicon, germanium or combination of silicon and germanium may be deposited, patterned and etched in a conventional manner to form source and drain regions. Alternatively, silicon layer 130 may be patterned and etched to form source and drain regions.

Figure 3:
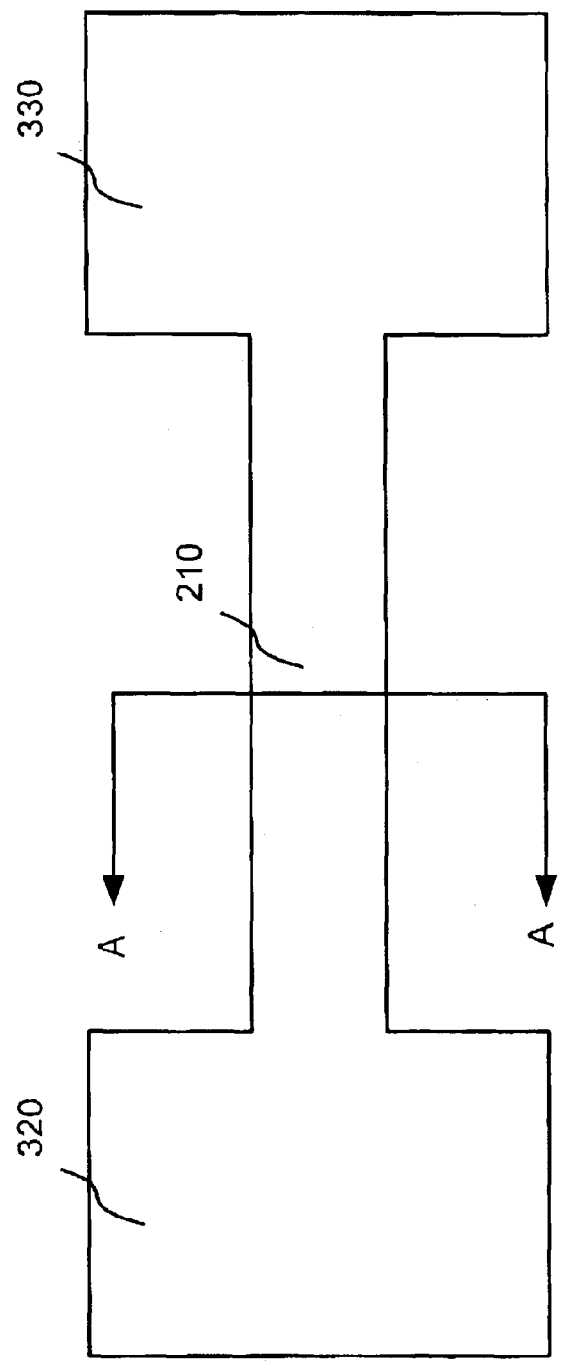
FIG. 3 is a top view illustrating the semiconductor device of FIG. 2 in accordance with an exemplary embodiment of the present invention.

FIG. 3 illustrates a top view of the semiconductor device 100 of FIG. 2 consistent with the present invention after the source and drain regions are formed. The cross-section illustrated in FIG. 2 is taken along line AA in FIG. 3. As illustrated in FIG. 3, semiconductor device 100 includes fin 210, source region 320 and drain region 330.

Figure 4:
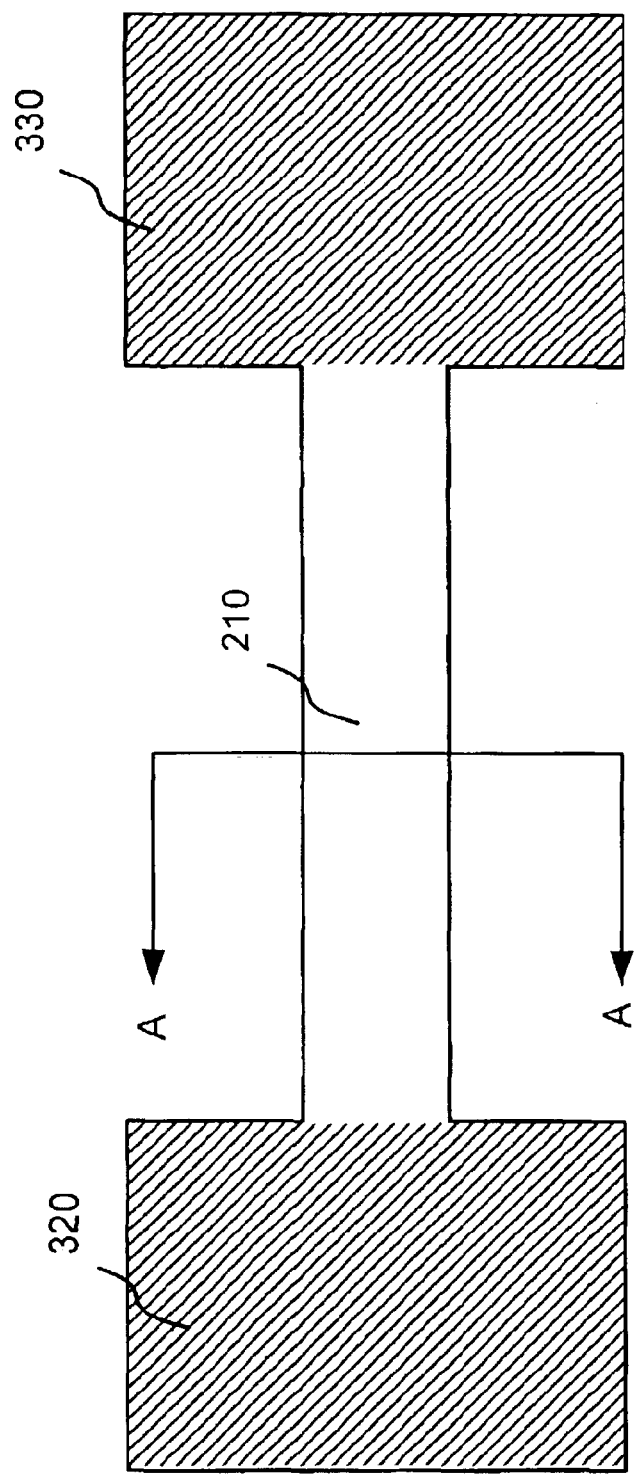
FIG. 4 is a top view illustrating the formation of a mask on the semiconductor device of FIG. 3 in accordance with an exemplary embodiment of the present invention.

Next, the source region 320 and drain region 330 may be covered, for example, with a mask, as indicated by the cross-hatching illustrated in source/drain regions 320 and 330 in FIG. 4. The mask may be a hard mask comprising a silicon oxide, silicon nitride or some other material. The fin 210 may then be thinned.

Figure 5:
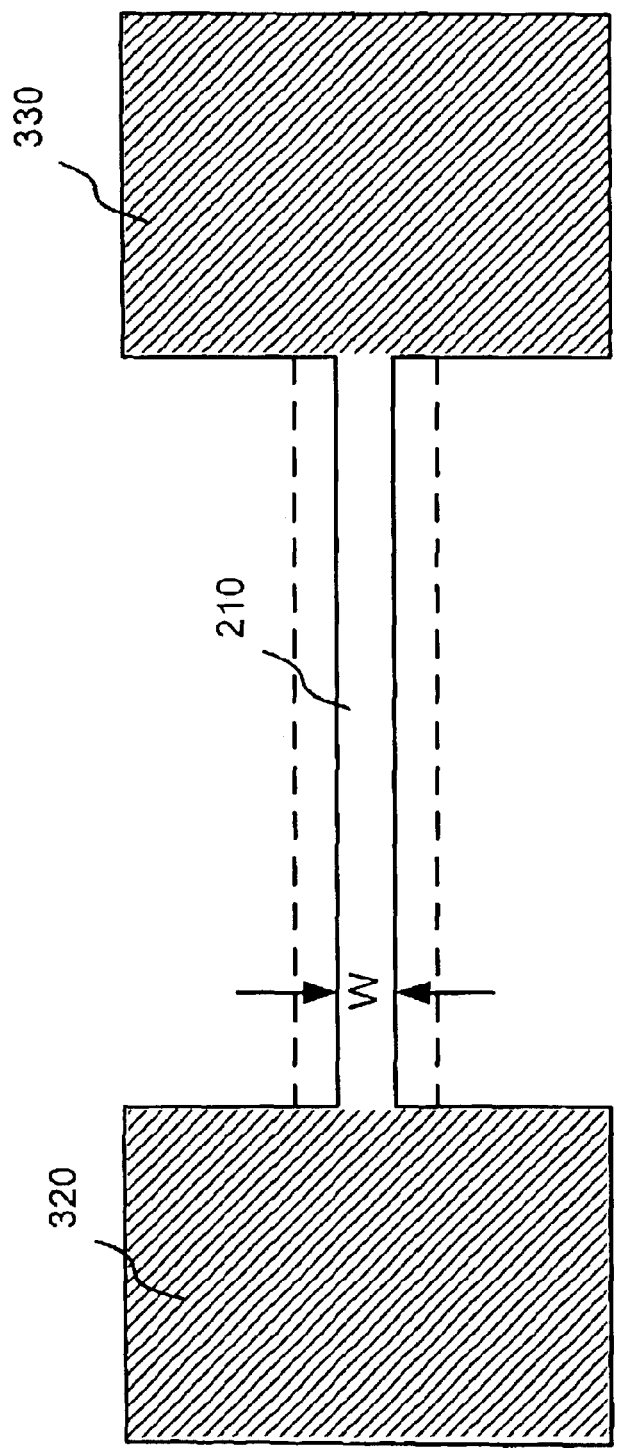
FIG. 5 is a top view illustrating the thinning of the fin of the semiconductor device of FIG. 4 in accordance with an exemplary embodiment of the present invention.

For example, an isotropic etch may be performed to thin fin 210 in the channel region of semiconductor device 100, as illustrated in FIG. 5. Referring to FIG. 5, the dotted lines represent the width of fin 210 prior to the etching. In an exemplary embodiment, the width of fin 210 after the etching (represented by "W" in FIG. 5) may be as small about 50 Å to about 200 Å. Advantageously, the thin fin 210 enables semiconductor device 100 to achieve better short-channel control.

Figure 6:
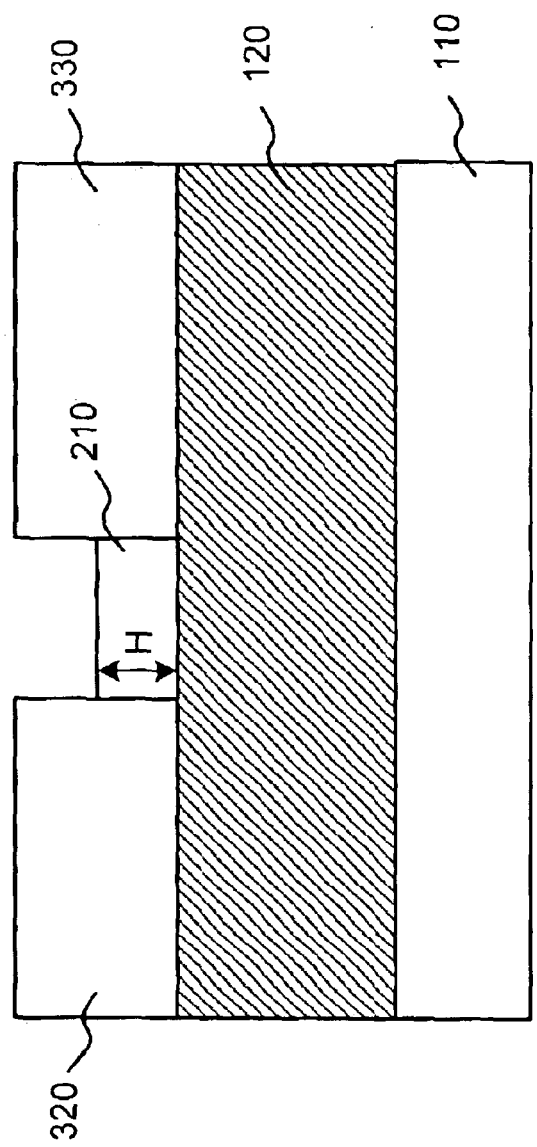
FIG. 6 is a cross-section illustrating the thinned fin of the semiconductor device of FIG. 5 in accordance with an exemplary embodiment of the present invention.

During the isotropic etching, the height or thickness of fin 210 in the vertical direction may also be reduced, as illustrated in FIG. 6. In an exemplary embodiment, the thickness of fin 210 in the vertical direction may be reduced by about 200 Å to about 400 Å during the etching. The resulting thickness of fin 210 in the vertical direction (represented by "H" in FIG. 6) may be as small as about 500 Å to about 800 Å.

The particular etch chemistry, gas flow rates, power ranges, bias voltages, etch duration and other parameters associated with etching fin 210 may be optimized based on the thickness of fin 210 prior to the etching and the particular end device requirements. In an exemplary implementation, the isotropic etch of fin 210 may use a wet etch chemistry.

In addition, the mask formed over the source/drain areas 320 and 330 (illustrated in FIG. 4) may be removed via a conventional etching, thereby exposing the source/drain areas 320 and 330, as illustrated in FIG. 6. Alternatively, the hard mask may be left covering the source/drain areas 320 and 330.

Figure 7:
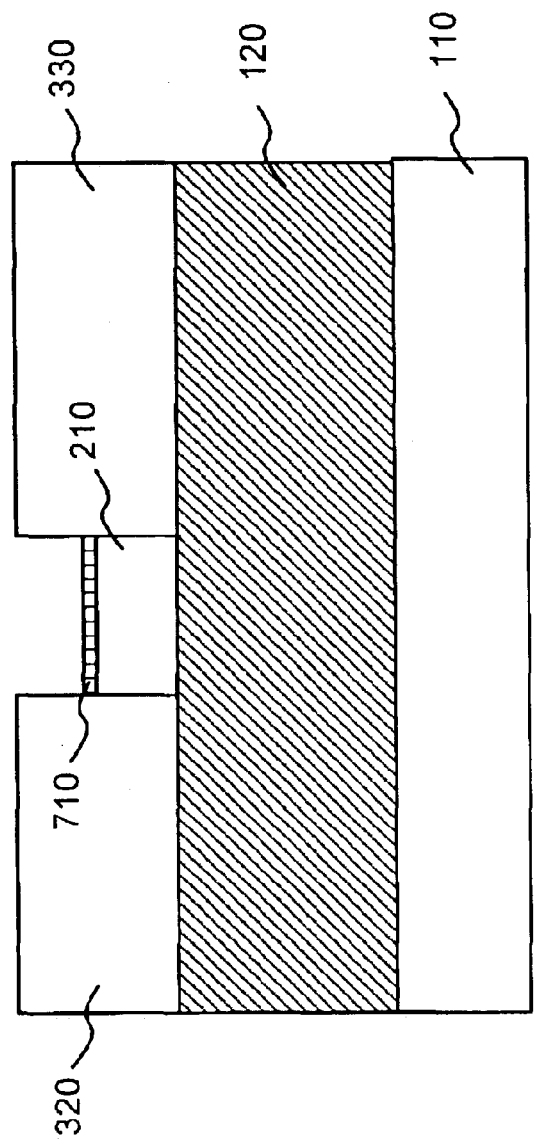
FIG. 7 is a cross-section illustrating the formation of a gate dielectric on the semiconductor device of FIG. 6 in accordance with an exemplary embodiment of the present invention.

A dielectric layer 710, such as a silicon oxide layer (e.g., $SiO_2$) or a silicon nitride layer (e.g., $Si_3N_4$), may be formed over fin 210, as illustrated in FIG. 7. Dielectric layer 710 may act as a gate dielectric for a subsequently formed gate and/or as a protective cap to protect the fin 210 during subsequent processing. In an exemplary implementation, dielectric layer 710 may be deposited or thermally grown on fin 210 to a thickness ranging from about 10 Å to about 20 Å. In alternative implementations, more than one dielectric layer may be formed over fin 210, such as an oxide layer with a nitride layer formed thereon.

A conductive layer may then be deposited to form a gate electrode. In an exemplary implementation, the conductive layer may include polysilicon deposited using conventional chemical vapor deposition (CVD) to a thickness ranging from about 300 Å to about 800 Å. Alternatively, other semiconducting materials, such as germanium or combinations of silicon and germanium, or various metals may be used as the gate material. The conductive layer may be patterned and etched to form a gate electrode 810, as illustrated in FIG. 8A.

Referring to FIG. 8A, the gate electrode 810 is formed over the fin 210 and gate dielectric 710 in the channel region of semiconductor device 100. The source and drain regions 320 and 330, respectively, are thicker in the vertical direction than fin 210, as illustrated in FIG. 8A. That is, source and drain regions 320 and 330 are effectively raised to a height above fin 210 in the vertical direction as a result of the isotropic thinning of fin 210 described above with respect to FIGS. 5 and 6. In an exemplary implementation, the height or thickness of the source/drain regions 320 and 330 may be at least 200 Å greater than the height or thickness of fin 210. For example, the height of the source/drain regions 320 and 330 may range from 700 Å to 1000 Å when the height of fin 210 ranges from 500 Å to 800 Å. Advantageously, the raised source/drain regions 320 and 330 can reduce source/drain series resistance and hence improve device drive current.

Figure 8B:
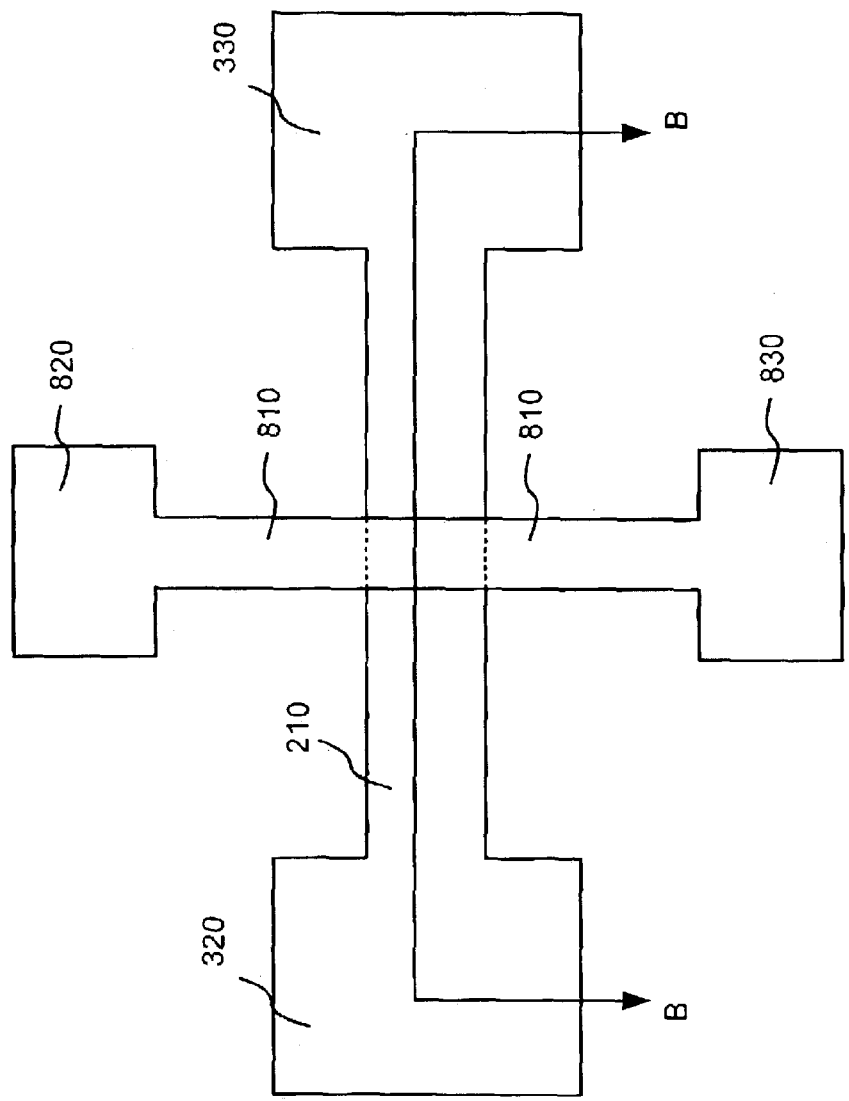
FIG. 8B is a top view illustrating an exemplary double-gate device formed in accordance with an exemplary embodiment of the present invention.

FIG. 8B illustrates a top view of semiconductor device 100 consistent with the present invention after the gate electrode 810 is formed. The cross section illustrated in FIG. 8A is taken along line BB in FIG. 8B. Referring to FIG. 8B, semiconductor device 100 includes a double gate structure with gate electrode 810 being disposed on either side of fin 210. The dielectric layer 710 (FIG. 7) above the upper surface of fin 210 is not shown in FIG. 8B for simplicity. Gate electrode 810 may include gate contacts 820 and 830 formed at the respective ends of gate electrode 810, as illustrated in FIG. 8B. The resulting semiconductor device 100 illustrated in FIGS. 8A and 8B is a double-gate device with a gate electrode disposed on either side of fin 210.

The source/drain regions 320 and 330 may then be doped. For example, n-type or p-type impurities may be implanted in source/drain regions 320 and 330. The particular implantation dosages and energies may be selected based on the particular end device requirements. One or ordinary skill in this art would be able to optimize the source/drain implantation process based on the circuit requirements and such steps are not disclosed herein in order not to unduly obscure the thrust of the present invention. In addition, sidewall spacers may optionally be formed prior to the source/drain ion implantation to control the location of the source/drain junctions based on the particular circuit requirements. Activation annealing may then be performed to activate the source/drain regions 320 and 330.

Thus, in accordance with the present invention, a double-gate FinFET device is formed with a narrow fin and source/drain regions that are raised up in the vertical direction with respect to the fin. Advantageously, the resulting structure exhibits good short channel behavior, reduces source/drain series resistance and improves device drive current. In addition, the present invention provides increased flexibility and can be easily integrated into conventional processing. Further, the present invention has been described with exemplary parameters associated with various parts of a semiconductor device 100, such as the exemplary thickness and width of fin 210 and the exemplary thickness of source/drain regions 320 and 330. It should be understood that these values are exemplary only and the actual thicknesses and width of these structures may be optimized based on the particular circuit requirements.

OTHER EXEMPLARY EMBODIMENTS

Figure 9B:
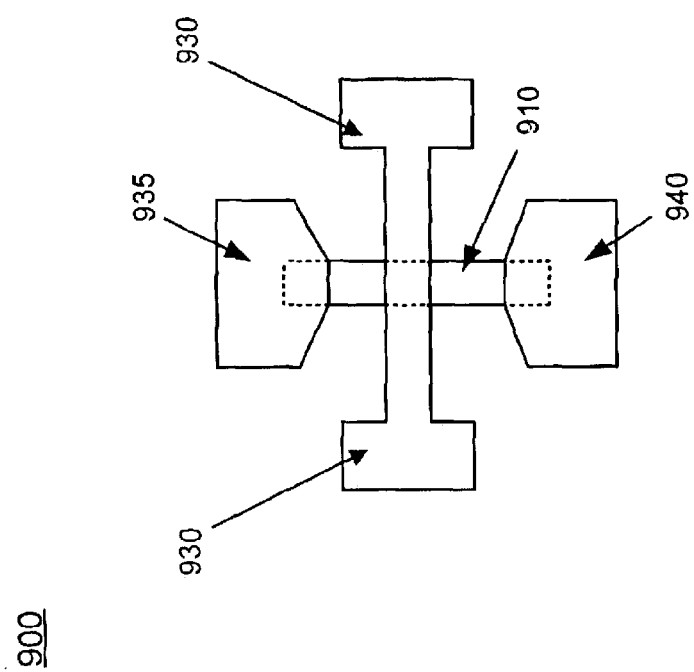
Figure 9A:
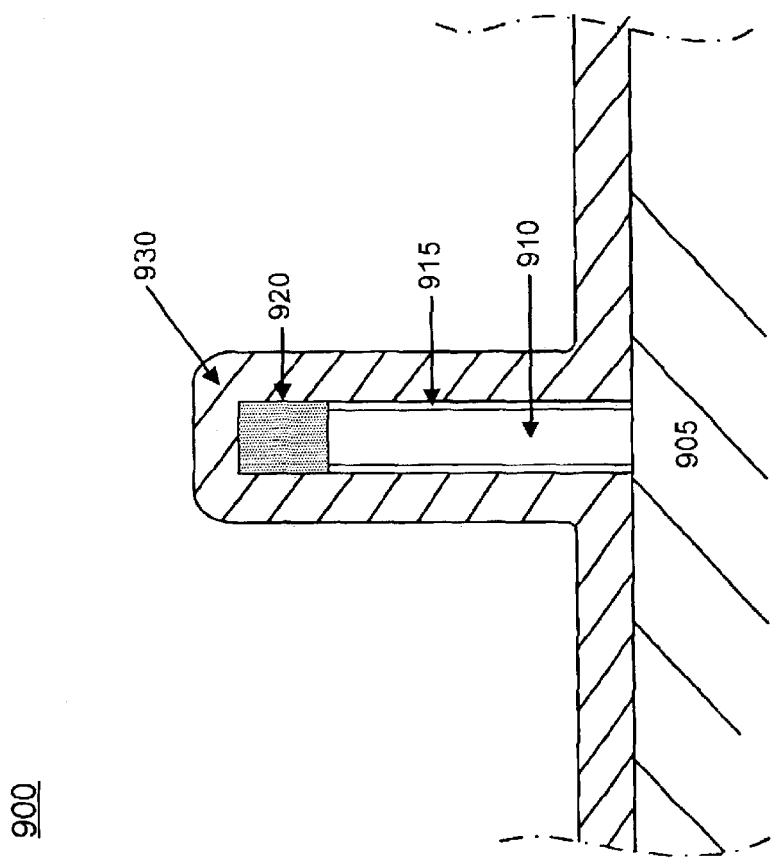

In some implementations, a FinFET may be formed with asymmetric gates. For example, semiconductor device 900 in FIG. 9A may include a buried oxide layer 905 formed on a substrate (not shown). Silicon fin 910 may be formed in a conventional manner, with gate dielectric 915 formed on the side surfaces of fin 910 and dielectric cap 920 formed over the top surface of the fin 910, as illustrated in FIG. 9A. The dielectric cap 920 may comprise a silicon nitride, silicon oxide or another dielectric. Gate electrode 930 may be formed over fin 910 and may comprise polysilicon. FIG. 9B illustrates the top view of the semiconductor device 900 of FIG. 9A. Referring to FIG. 9B, semiconductor device 900 includes source region 935 and drain region 940 disposed on either side of fin 910 and gate electrode 930 formed over fin 910.

Figure 9E:
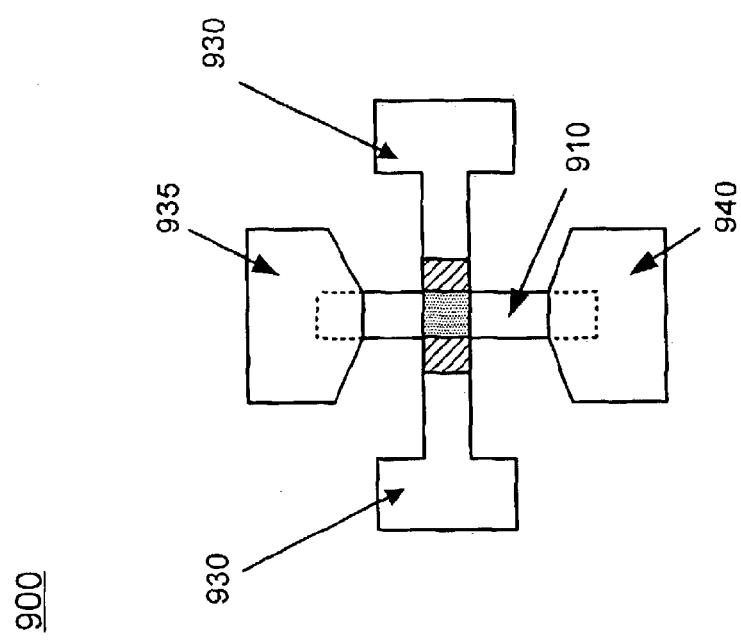
Figure 9D:
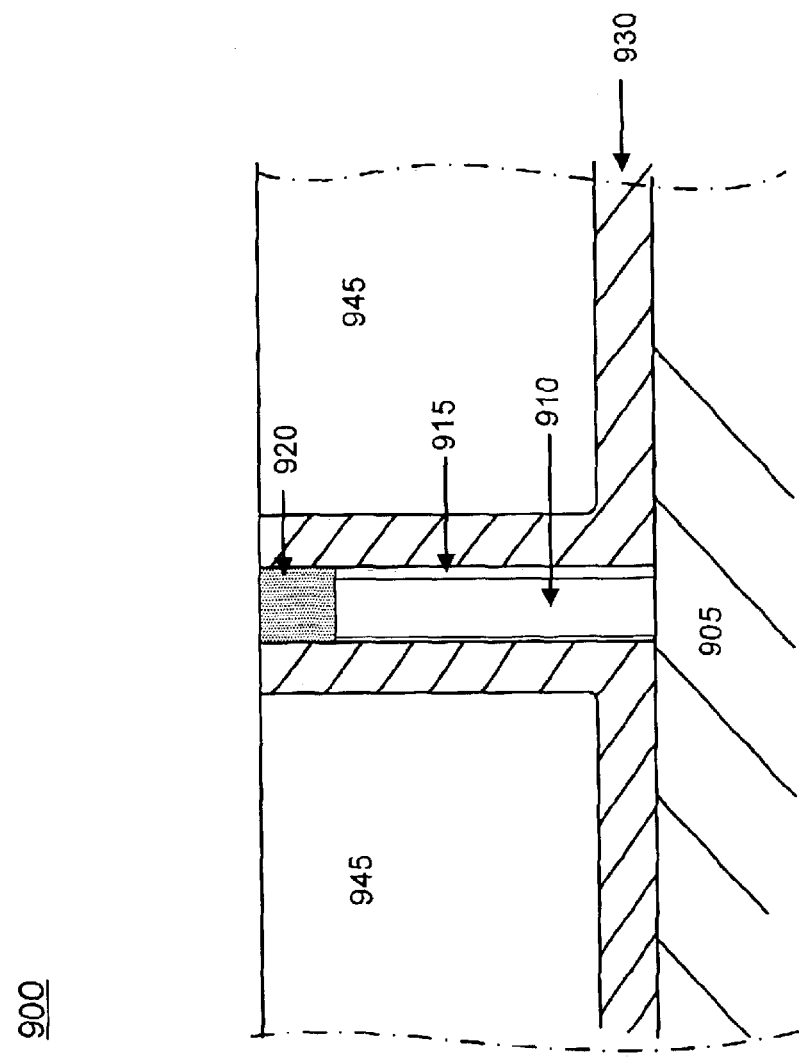

A thick oxide layer 945 may be deposited over gate electrode 930 and polished to from a relatively flat surface, as illustrated in FIG. 9C. The polishing of oxide layer 945 may continue until polysilicon gate 930 and dielectric cap 920 are exposed, as illustrated in FIG. 9D. FIG. 9E illustrates a top view of semiconductor device 900 after dielectric cap 920 and gate electrode 930 are exposed. The cross-hatched areas in FIG. 9E located adjacent fin 910 represent the exposed portions of gate electrode 930.

Figure 9F:
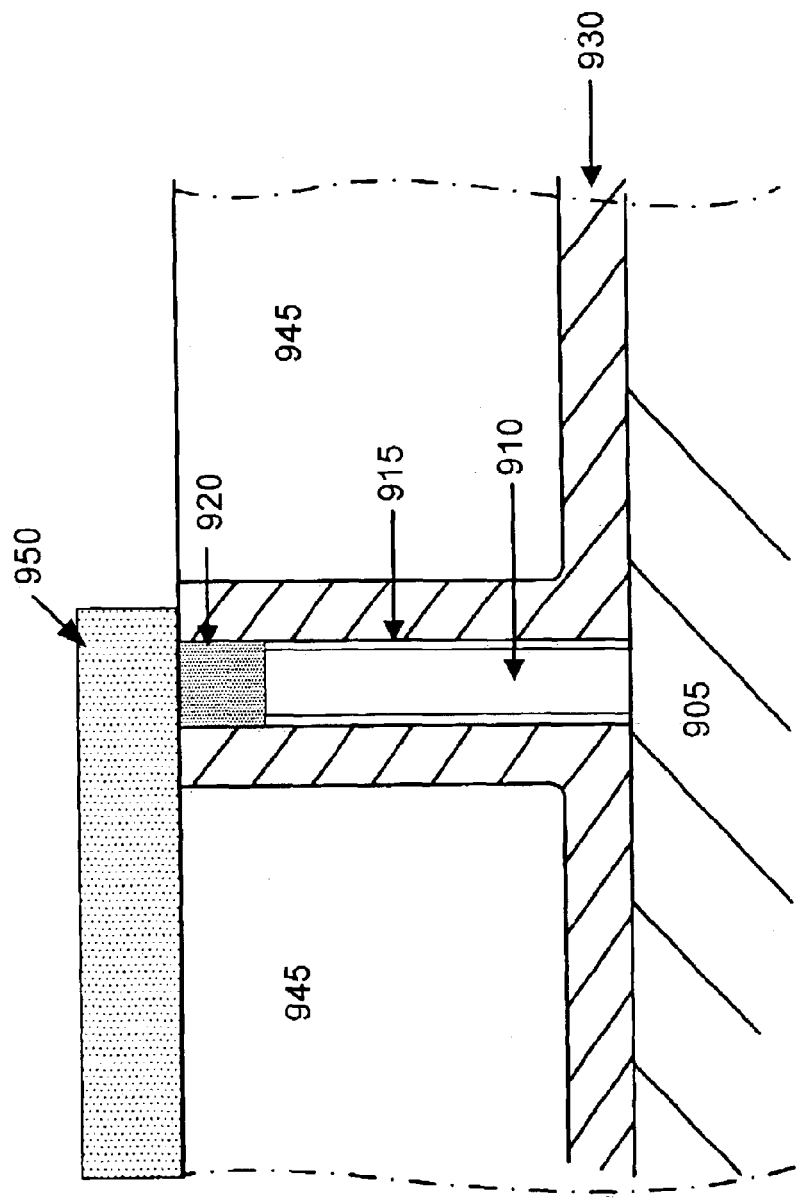

A photoresist material 950 may then be deposited to cover one side of semiconductor device 900, as illustrated in FIG. 9F. The thickness of photoresist layer 950 may be about 100 nm. The photoresist layer 950 may cover a portion of the gate electrode 930 on one side of fin 910. For example, in FIG. 9F, photoresist layer 950 covers the left side of gate electrode 930. In an exemplary implementation, photoresist material 950 may also cover or overlay about 30 nm of the uncovered side of gate electrode 930 (i.e., the right side in FIG. 9F) and at least 40 nm of the uncovered side of gate electrode 930 will be exposed, as illustrated in FIG. 9F.

The exposed polysilicon in gate electrode layer 930 may then be etched via, for example, an isotropic etch. The etching may use, for example, HBr, and may be very selective to polysilicon. During the etching, the polysilicon in gate electrode 930 not located under the photoresist layer 950 may be removed, as illustrated in FIG. 9G. In addition, the small portion of polysilicon on the right side of gate electrode 930 in FIG. 9G located below photoresist layer 950 may also be removed (i.e., the portion under the overlaying part of photoresist layer 950).

Figure 9H:
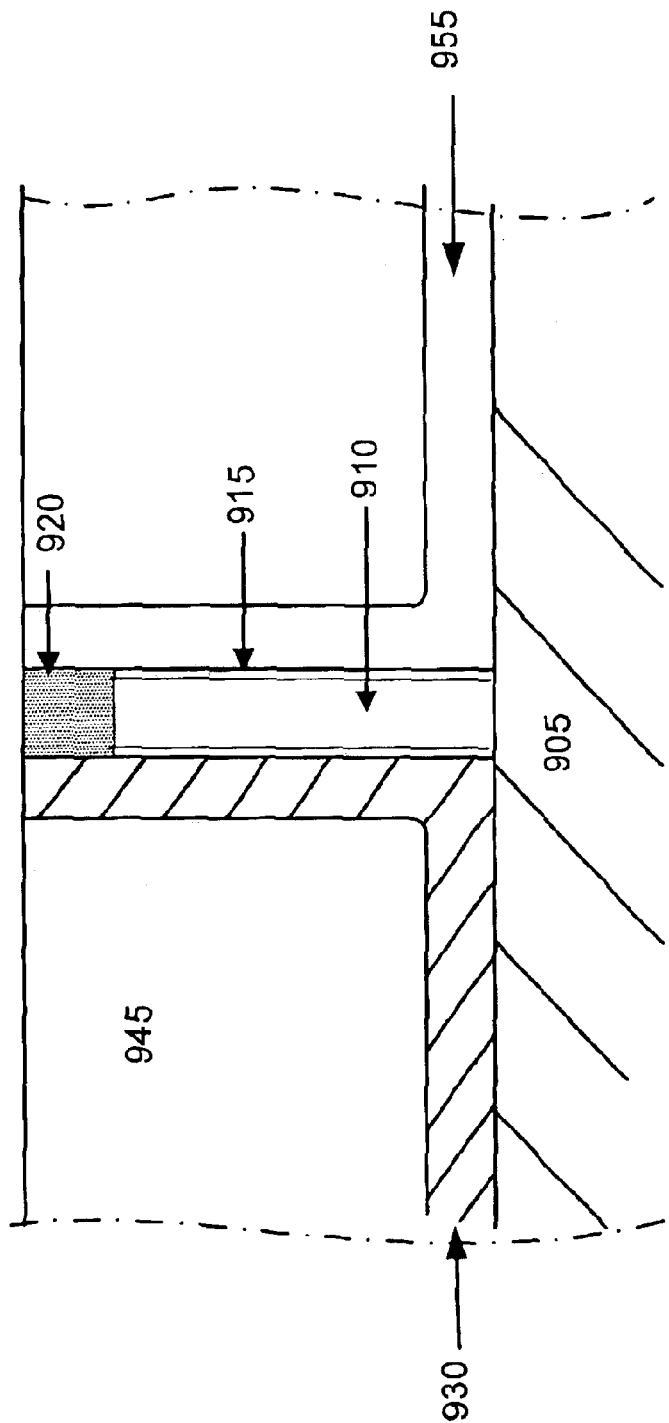

The photoresist layer 950 may then be stripped and the polysilicon that has been removed may be replaced with polysilicon having a different dopant. For example, if polysilicon layer 930 was doped with n-type impurities, a polysilicon layer doped with p-type impurities may be deposited on the right side of fin 910. The polysilicon may be deposited via a chemical vapor deposition (CVD) process and may be patterned to form a gate electrode 955 on the right side of fin 910, as illustrated in FIG. 9H.

The resulting semiconductor device 900 is a double-gate device with a first gale electrode 930 and a second gate electrode 955. Since the gate electrodes 930 and 955 are asymmetrically doped, gates 930 and 955 may have different work functions. In addition, by varying the dopant concentrations, the threshold voltage of gate electrodes 930 and 955 may be independently adjusted based on the particular circuit requirements.

In an alternative implementation, asymmetric gates may be formed by an etchback of a damascene gate electrode. For example, semiconductor device 1000 of FIG. 10A includes a buried oxide layer 1005 formed on a substrate (not shown). Silicon fin 1000 may be formed on buried oxide layer 1005 and source region 1015 and drain region 1020 may be formed adjacent either side of fin 1005. A nitride layer 1025 may be formed over the upper surface of fin 1010 and source/drain regions 1015 and 1020, as illustrated in Fig. 10A. FIG. 10B illustrates a top view of semiconductor device 1000 of FIG. 10A. The nitride layer 1025 is not illustrated in FIG. 10A for simplicity.

Figures 10C, 10D:
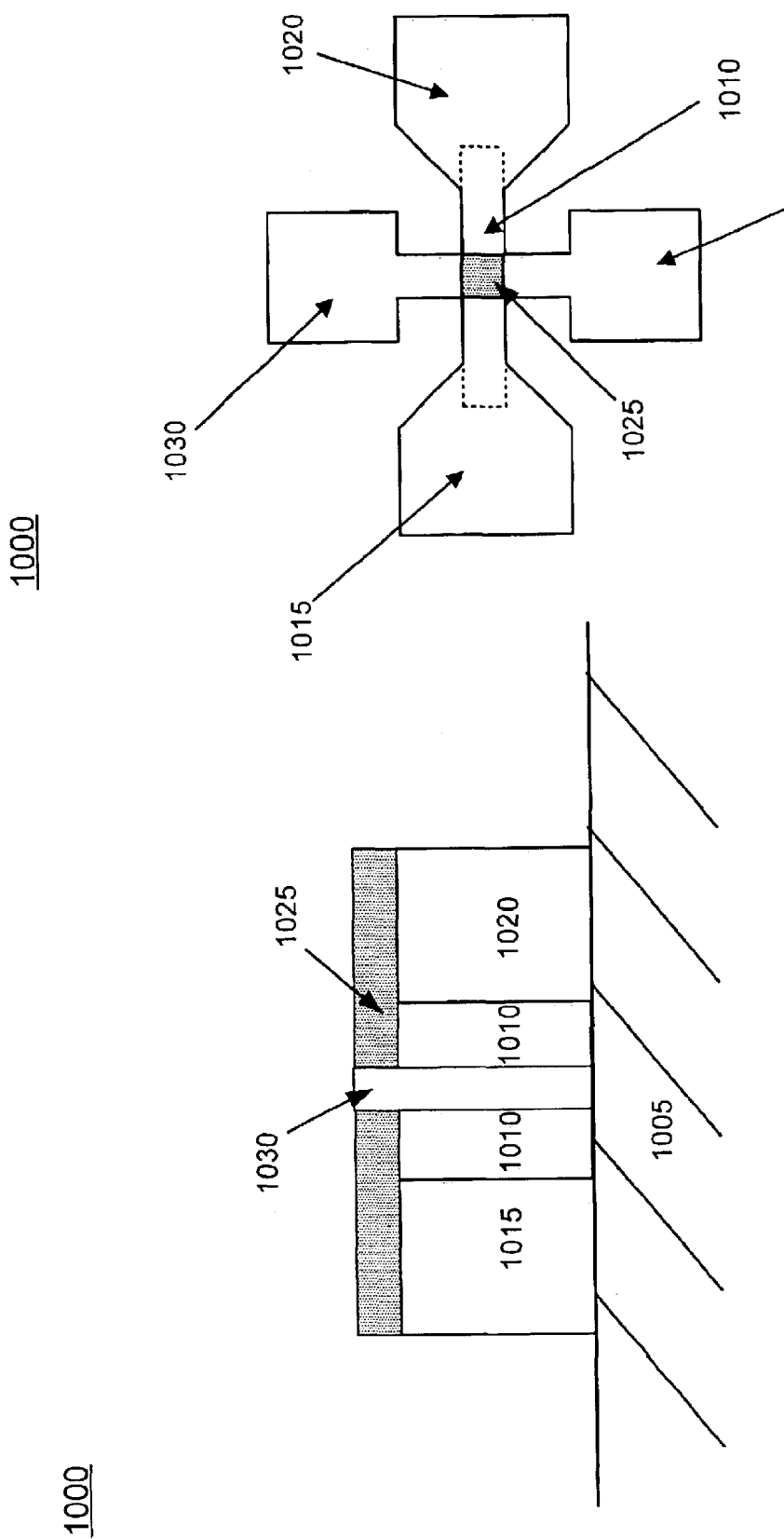

A damascene gate electrode 1030 may then be formed as illustrated in FIG. 10C. The gate electrode 1030 may be planarized so that the top surface of the gate electrode 1030 is planar with nitride layer 1025. FIG. 10D illustrates a top view of semiconductor device 1000 of FIG. 10C. In some implementations, nitride layer 1025 may cover the center portion of fin 1010 and electrically separates one side of gate electrode 1030 from the other side of gate electrode 1030, as illustrated in FIG. 10D.

Figure 10E:
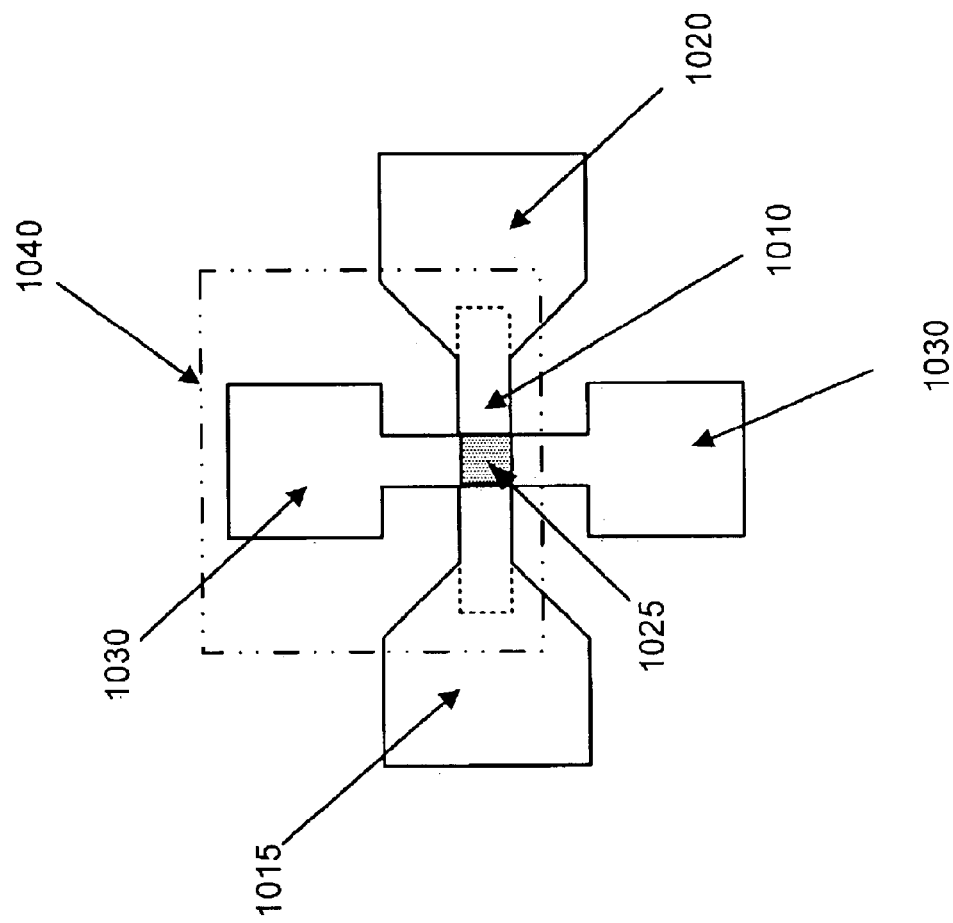
Figure 10F:
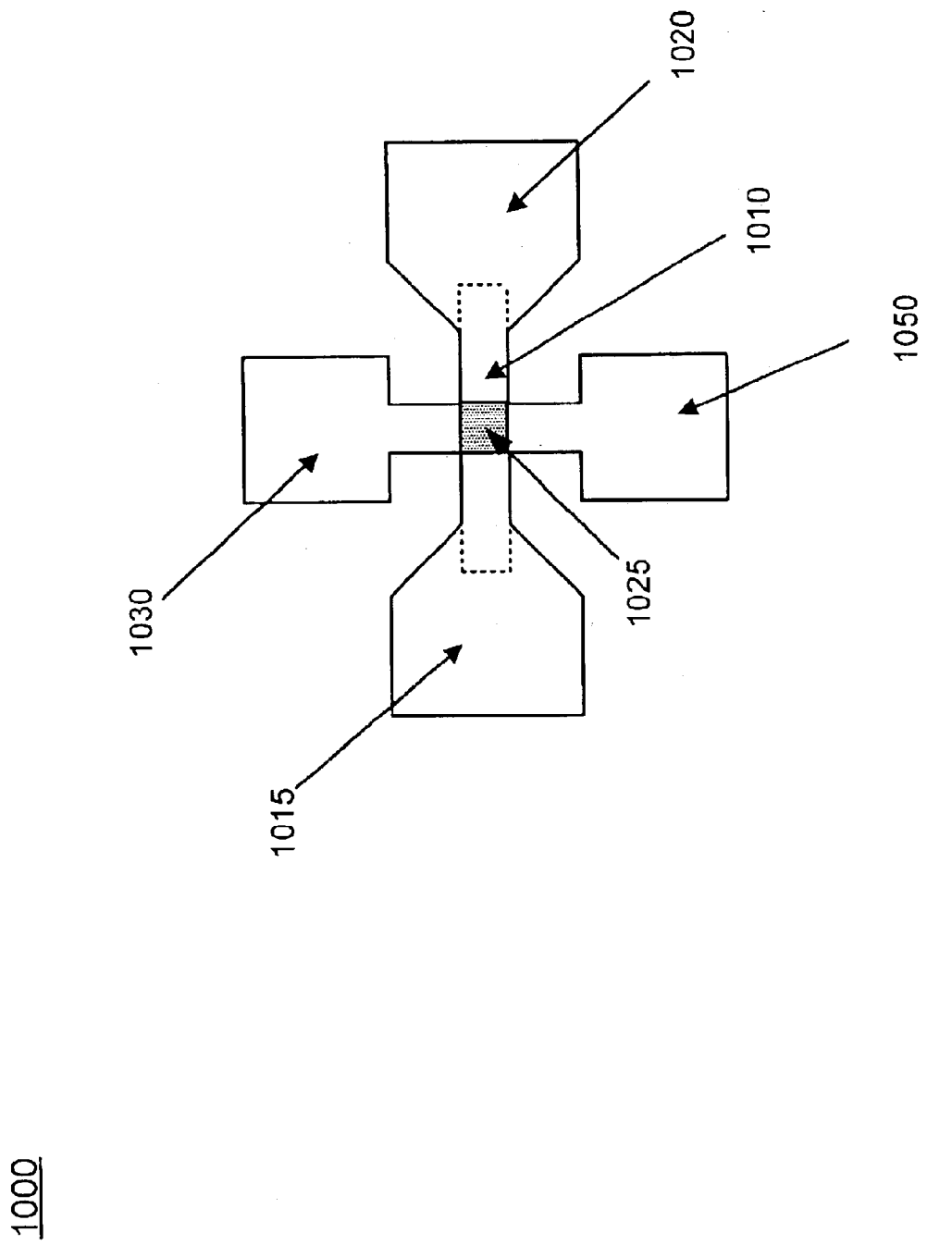

A photoresist mask 1040 may then be formed on one side of semiconductor device 1000, as illustrated in Fig. 10E. An isotropic poly etch may then be performed to remove the polysilicon in gate electrode 1030 not covered by mask 1040 (i.e., the bottom portion of gate electrode 1030 in FIG. 10E). For example, an isotropic etch using HBr or $SF_6$ may be used to remove the polysilicon in gate electrode 1030 not protected by mask 1040. Doped n-type of p-type polysilicon may then be deposited. For example, if gate electrode 1030 was doped with n-type impurities, a polysilicon layer doped with p-type impurities may be deposited and planarized to form a p-type doped polysilicon gate electrode. For example, the polysilicon may be deposited via a chemical vapor deposition (CVD) process and patterned to form gate electrode 1050, as illustrated in Fig. 10F. Alternatively, a metal may be deposited and polished to form a metal gate electrode 1050.

The resulting semiconductor device 1000 is a double-gate device with a first gate electrode 1030 and a second gate electrode 1050. The gates electrodes are electrically and physically separated by fin 1010. Each of the gate electrodes 1030 and 1050 may be separately biased. For example, gate electrode 1030 may be biased with a different voltage than gate electrode 1050 based on the particular circuit requirements. In addition, since the gate electrodes 1030 and 1050 are asymmetrically doped, the gates 1030 and 1050 will have different work functions. By varying the dopant concentrations, the threshold voltage of gate electrodes 1030 and 1050 may be independently adjusted based on the particular circuit requirements.

The embodiments illustrated in FIGS. 9A–9H and 10A–10F enable the formation of asymmetric gates and/or independent gates without requiring independent patterning. The procedures are self-aligned and may be used with both conventional and damascene double-gate definition schemes.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device, comprising:
   a substrate;
   an insulating layer formed on the substrate;
   a fin formed on the insulating layer, the fin having a width ranging from about 50 Å to about 200 Å and thickness ranging from 600 Å to about 800 Å in a channel region of the semiconductor device;
   a source region formed on the insulating layer adjacent a first side of the fin; and
   a drain region formed on the insulating layer adjacent a second side of the fin opposite the first side, wherein the source and drain regions have a greater thickness than the fin and the thickness of the source and drain regions ranges from about 700 Å to 900 Å.

2. The semiconductor device 1, further comprising:
   a gate formed over a top surface of the fin in the channel region of the semiconductor device.

3. The semiconductor device of claim 2, wherein the gate comprises a first gate disposed on a third side of the fin and a second gate disposed on a fourth side of the fin opposite the third side.

4. The semiconductor device of claim 2, wherein the gate has a thickness ranging from about 300 Å to about 800 Å.

5. The semiconductor device of claim 1, further comprising:
   at least one dielectric layer formed over a top surface of the fin.

6. The semiconductor device of claim 5, further comprising:
   a gate formed over the at least one dielectric layer and being disposed on a third and fourth side of the fin.

7. The semiconductor device of claim 5, wherein the at least one dielectric layer formed over a top surface of the fin comprises:
   an oxide layer and a nitride layer formed on the oxide layer.

8. The semiconductor device of claim 5, wherein the at least one dielectric layer formed over a top surface of the fin has a thickness ranging from about 10 Å to about 20 Å.

9. The semiconductor device of claim 1, wherein the insulating layer comprises a buried oxide layer and the fin comprises at least one of silicon and germanium.

10. A semiconductor device, comprising:
    a substrate;
    an insulating layer disposed on the substrate;
    a conductive fin formed on the insulating layer, the conductive fin having a first end and a second end, wherein the conductive fin has a thickness ranging from about 600 Å to about 800 Å and a width ranging from about 50 Å to about 200 Å in a channel region of the semiconductor device;
    a source region formed adjacent the first end of the conductive fin, the source region having a thickness ranging from about 700 Å to about 900 Å; and a drain region formed adjacent the second end of the conductive fin, the drain region having a thickness ranging from about 700 Å to about 900 Å, and wherein the source and drain regions have a greater thickness than the conductive fin in the channel region of the semiconductor device.

11. The semiconductor device of claim 10, further comprising:

a gate dielectric layer formed on the conductive fin in the channel region of the semiconductor device; and a gate formed over the gate dielectric layer.

12. The semiconductor device of claim 11, wherein the gate comprises a first gate electrode disposed on a first side of the conductive fin and a second gate electrode disposed on a second side of the conductive fin opposite the first side.

13. The semiconductor device of claim 11, wherein the gate has a thickness ranging from about 300 Å out 800 Å.

14. The semiconductor device of claim 11, wherein the gate dielectric layer comprises:

an oxide layer and a nitride layer formed on the oxide layer.

15. The semiconductor device of claim 11, wherein the gate dielectric layer has a thickness ranging from about 10 Å to about 20 Å.

16. The semiconductor device of claim 10, wherein the source and drain regions are each at least about 200 Å thicker than the conductive fin in the channel region of the semiconductor device.

* * * * *